United States Patent [19]

Movchan et al.

[11] Patent Number: 5,242,479
[45] Date of Patent: Sep. 7, 1993

[54] APPARATUS AND METHOD FOR PRODUCING CARBIDE COATINGS

[75] Inventors: Boris A. Movchan; Alexander A. Chevychelov, both of Kiev, U.S.S.R.; Raymond F. Decker, Ann Arbor, Mich.

[73] Assignee: Paton Tek, Inc., Ann Arbor, Mich.

[21] Appl. No.: 888,877

[22] Filed: May 26, 1992

[51] Int. Cl.⁵ .............................................. C22B 4/00
[52] U.S. Cl. ................................... 75/10.13; 423/346; 423/440
[58] Field of Search .............. 75/10.13; 148/316; 423/346, 440, 446

[56] References Cited

U.S. PATENT DOCUMENTS

| | | | |
|---|---|---|---|
| 3,340,020 | 9/1967 | Neuenschwander | 423/346 |
| 3,961,103 | 6/1976 | Aisenberg | 423/446 |
| 4,153,527 | 5/1979 | Greenewald | 423/346 |
| 4,610,857 | 9/1986 | Ogawa | 423/440 |
| 5,131,992 | 7/1992 | Church | 423/440 |

*Primary Examiner*—Peter D. Rosenberg
*Attorney, Agent, or Firm*—Harness, Dickey & Pierce

[57] ABSTRACT

This invention relates to a method and apparatus for developing a metallic carbide coating on a substrate. The invention involves providing an enclosed chamber with sources of carbon in the form of a blank and an ingot of a metal material taken from the group including titanium, boron and silicon. Electron beam guns are employed to heat the carbon source causing a carbon vapor flow within the vessel. In accordance with this invention, the metal ingot is subjected to two distinct heating steps. A first heating step preferably using an electron beam gun, melts the ingot and the molten material flows onto a refractory surface where it is subjected to a second heating step, preferably also using an electron beam gun. The plural heating approach of this invention has been found to produce significant increases in metal vaporization rate, thus permitting a higher rate of formation of metallic carbide to be provided on the substrate.

12 Claims, 1 Drawing Sheet

APPARATUS AND METHOD FOR PRODUCING CARBIDE COATINGS

BACKGROUND OF THE INVENTION

This invention relates to an apparatus and method for forming composites, and particularly to forming layers of certain types of carbide coatings.

Layers of carbide materials such as titanium carbide (TiC), boron carbide ($B_4C$) and silicon carbide (SiC) are often coated on surfaces for various commercial and scientific applications. Such surface coatings can be used in the tool making industry to produce super hard coatings on alloy tools. Such composites find particular utility in producing cutting tools and in providing wear resistant coatings for parts. Various approaches toward forming such coatings are presently known. However, the prior art approaches have limitations in terms of the surface quality of the coating which can be developed, and in the deposition rate of forming the coatings.

One previously known approach of providing a titanium carbide coating is through plasma spraying. In plasma spraying, titanium carbide powder is introduced into a plasma jet where it is intensely heated to melting and sprayed to form a coating on the part surface. The thickness of coatings produced by plasma spraying is from tens of microns up to several millimeters. However, the materials produced by this method tend to have a high porosity; more than 10%. For this reason it is recommended to use dispersed powders to reduce the coating porosity, but it is difficult to introduce such agents into the plasma jet.

Also know is a process of developing a titanium carbide layer through detonation coating. This process, however tends to produce low quality coatings.

Another known process is the use of a direct electron beam evaporation of titanium carbide. Billets for evaporation are produced by a powder metallurgy process. The billets are evaporated from a water-cooled crucible. The maximum titanium carbide deposition rate which can be achieved by this method, however, is on the order of 0.3 $\mu$m/min, and thus this process is not promising for industrial applications where relatively thick coatings are often required.

Activated reactive evaporation is another known technique for producing a titanium carbide coating. Evaporation is caused by an electron beam. At the same time, a reaction gas such as methane is fed into a chamber at a low pressure. Titanium carbide is formed both in the gas phase, and on the substrate as a result of the reaction between the metal vapor and gas atoms:

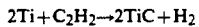

$$2Ti + C_2H_2 \rightarrow 2TiC + H_2$$

A charged grid is placed in the working space of the chamber to activate the chemical compound formation. By changing the reagent partial pressure it is possible to change the carbon-titanium ratio. The rate of titanium carbide coating deposition generally does not exceed 2.5 $\mu$m/min using this method.

Still another method for developing carbide coatings is based on electron beam evaporation of the initial component, e.g. titanium and carbon from separate sources and performing carbide synthesis on the substrate. The ratio of components in the coating can be controlled by changing the ratio of heating power of the materials evaporated from the sources. Low rates of initial component evaporation are the restrictive factor in the utilization of this electron beam process for titanium carbide-based coating deposition. Problems with this method are encountered when attempts are made to raise the deposition rate. Raising the power of heating of the carbon source above a critical value results in a marked increase in the number of graphite fragments in the vapor phase, and, as a result, in the appearance of defects, discontinuities and availability of free carbon in the condensate; resulting in lower quality of the resulting coating. Similarly, when attempts are made to increase the titanium evaporation rate by raising the heating power, intense spattering of the molten metal occurs which again degrades the ultimate surface quality.

Advances have been made in terms of enabling the evaporation rate of carbon heated by an electron beam to be increased without encountering solid carbon particles in the vapor. A molten intermediate pool of tungsten can be employed overlying the carbon source which prevents the direct heating of the graphite surface by the electron beam and provides the dissolution of the graphite particles through the formation of a tungsten carbide melt. Since the vapor pressure of carbon is higher than that of tungsten at a given temperature, it is primarily the carbon that evaporates from the melt. This advance, however, does not translate into a higher rate of titanium carbide deposition since the limiting factor remains the rate of titanium evaporation. Consequently, without raising the titanium evaporation rate the coatings produced by this method providing excess carbon results in a coating of titanium carbine and elemental carbon.

SUMMARY OF THE INVENTION

This invention comprises an improvement in the process of developing coatings of titanium carbide, boron carbide or silicon carbide through direct heating of metal and carbon sources. The invention utilizes a novel evaporation approach for the metal source. Preferably the method is employed with the previously discussed approach toward increasing carbon evaporation rates through the use of a tungsten melt. As described in more detail in the following detailed description of the invention, the apparatus and method employs separate heating steps for the metal source. A first heating step is provided to cause the metal from an ingot to melt. The molten metal flows onto a surface of a refractory material which is subjected to a second radiative heat source where rapid evaporation occurs. As a result of this two-stage heating process it has been found that significant increases in metal evaporation rates can be provided. This technique coupled with approaches toward providing high carbon evaporation rates have been found to enable significant increases in the rate of deposition of carbide coatings and provides such coatings of excellent quality.

Additional benefits and advantages of the present invention will become apparent to those skilled in the art to which this invention relates from the subsequent description of the preferred embodiments and the appended claims, taken in conjunction with the accompanying drawing.

DETAILED DESCRIPTION OF THE INVENTION

Figure 1:
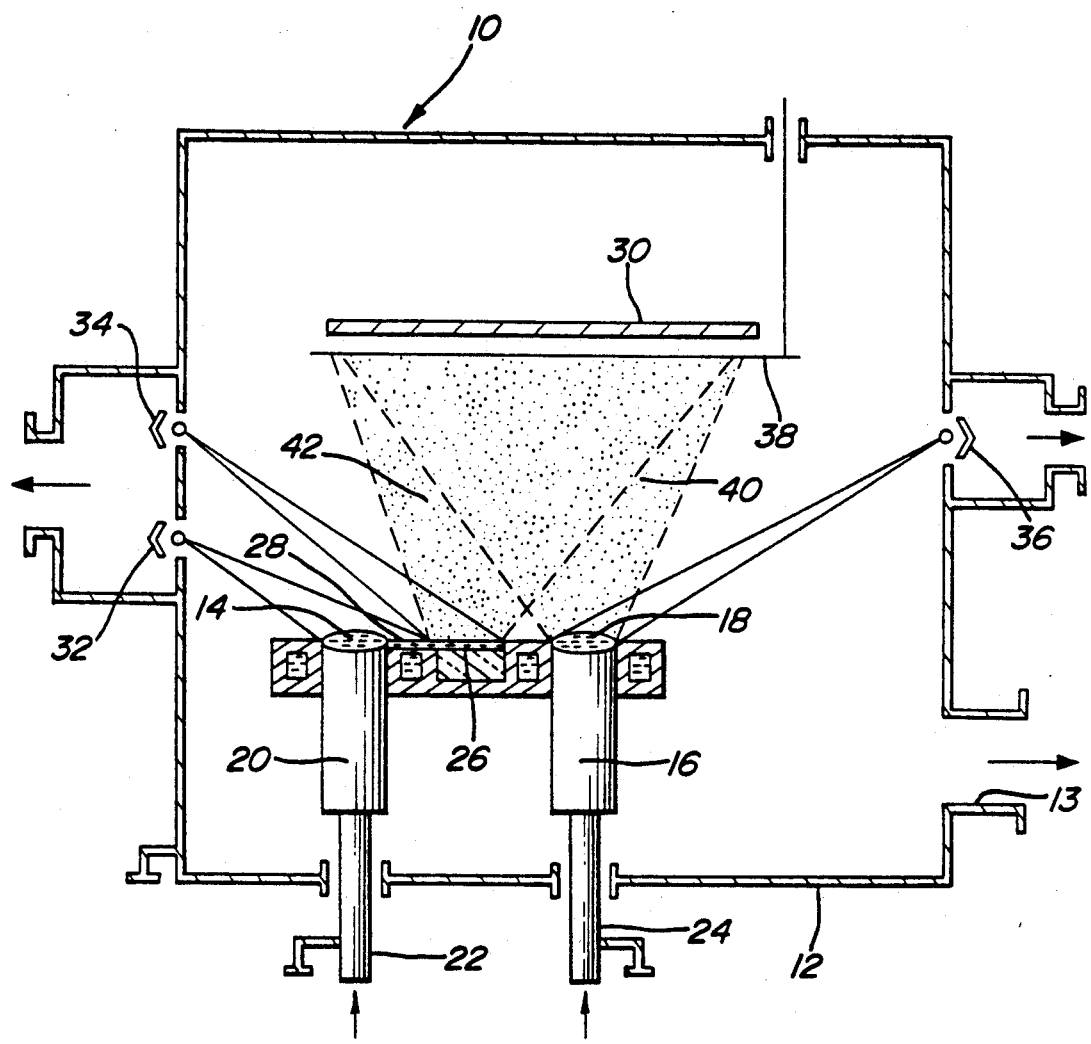
FIG. 1 is a schematic diagram of an apparatus according to this invention.

A treatment apparatus in accordance with this invention is shown in FIG. 1 and is generally designated there by reference number 10. Treatment apparatus 10 includes vacuum chamber 12 which accommodates a copper water-cooled crucible 14. Port 13 is provided to enable the atmosphere within chamber 12 to be controlled. Crucible 14 holds a carbon rod 16 which acts as the carbon source. The upper surface of the carbon rod is covered by tungsten blank 18. Crucible 14 also holds an ingot 20 of a metal taken from the group including titanium, silicon, and boron. Push rods 22 and 24 are provided to advance carbon rod 16 and ingot 20 into crucible 14 as they are consumed. Crucible 14 defines a refractory surface 26 adjacent to ingot 20. Crucible 14 forms channel 28 between ingot 20 and refractory surface 26 to enable molten metal for evaporation to flow onto the refractory surface 26. Refractory surface 26 is preferably formed from materials taken from the group including carbon, hafnium, niobium, molybdenum, tantalum, and tungsten; all of which have a vapor pressure when heated which is lower than that of the metal of ingot 20.

A substrate 30 to be coated is placed in the upper part of vacuum chamber 12. Treatment apparatus 10 includes three discrete radiation sources which are preferably electron beam guns 32, 34 and 36. Electron beam gun 32 is provided for causing heating of the surface of ingot 20 to a level which causes it to melt. Electron beam gun 34 is incident upon refractory surface 26 and is provided for evaporating molten metal flowing onto that surface through channel 28. Electron beam gun 36 is provided for causing evaporation of carbon through melting of tungsten blank 18 which forms as a pool covering carbon rod 16. Gate 38 is located between substrate 30 and crucible 14 for regulating exposure of the substrate. All components of chamber 12 are grounded and a negative accelerating voltage is applied to the cathodes of the electron beam guns 32, 34 and 36.

In operation, vacuum chamber 12 is evacuated and substrate 30 is heated to a specified temperature, for example, by another electron beam (not shown). Tungsten blank 18 is heated by the electron beam from gun 36 to a level causing the formation of a melt thus carrying out the evaporation of carbon from rod 16, and the formation of carbon vapor flow 40. The electron beam from gun 32 melts the upper edge of ingot 20 and the molten metal thus formed flows through channel 28 onto the refractory surface 26 which is in turn heated by the electron beam from gun 34. When the molten metal flows onto surface 26 intense evaporation occurs without spattering resulting in the formation of metal vapor flow 42. When gate 38 is open, the mixed vapor flows 40 and 42 begin to condense on substrate 30 forming a coating containing carbide. As the evaporation process continues, ingot 20 and carbon rod 16 are consumed and are moved upward by push rods 22 and 24 at speeds providing a constant level of the molten pools relative to the upper edges of crucible 14. The coating composition can be controlled by changing the power ratio of electron guns 32, 34 and 36.

While the described embodiment of this invention designates three independent electron beams sources, it is fully within the scope of this invention to use a single steered electron beam which would be modulated in a manner to provide the desired controlled heating effect at the various target areas. Similarly, other types of radiative heating approaches are envisioned in connection with this invention; for example, certain laser sources are believed suitable in carrying out this invention. The following specific examples illustrate the development of titanium carbide coatings. The inventors further believe that boron carbide and silicon carbide coatings could be developed in accordance with this invention by using the appropriate material for ingot 20 and by providing minor variations to the operating parameters. Moreover, ingot 20 may be made of an alloy to provide the desired coating on substrate 30.

SPECIFIC EXAMPLE 1

An ingot 20 of titanium and a carbon rod 16 of 68.5 mm diameter were placed into separate cylindrical water-cooled copper crucibles 14 with a 70 mm inner diameter. Graphite in the form of a washer of 68.5 mm diameter and 40 mm height was used as the refractory surface 26 from which the titanium was evaporated. 300 grams of tungsten were placed on carbon rod 16. A vacuum of about $10^{-4}$ Torr was created in chamber 12. The substrate 30 of steel was heated by an electron beam to the temperature of 850° C. The tungsten on rod 16 was heated by the electron beam of gun 36 up to the formation of the melt, thus evaporating carbon from rod 16. The electron beam of gun 32 heated the upper edge of the titanium ingot 20 up to melting to form a molten pool. The graphite refractory surface 26 was heated by the electron beam of gun 34. The molten pool of titanium, due to the upward movement of the ingot 20, was poured through channel 28 onto surface 26, from which titanium was evaporated. Thereafter gate 38 was opened, and the vapor flows 40 and 42 were condensed onto substrate 30. The distance from the substrate 30 to the crucible 14 was about 400 mm. The gun 32 beam current was 0.8 A; the gun 34 current being 2.8 A; and the gun 36 beam current being 3.5 A. The accelerating voltage of all the guns was 20 KV. As the evaporation took place, the carbon rod 16 and the titanium ingot 20 were moved upward with the speed providing the constant level of the molten pools relative to the upper edge of the crucible 14.

The rate of coating deposition was 100–105 μm/min. X-ray analysis of the substrate revealed that the coating consists of titanium carbide and titanium as a binder. No free carbon was found. Chemical analysis showed that the titanium carbide content in the coating is 75% wt.

SPECIFIC EXAMPLE 2

The conditions of this example are similar to those described in Example 1, except for the fact that tungsten was used for refractory surface 26 as opposed to carbon. The beam current of gun 32 was 0.8 A; the beam current of gun 34 was 2.8 A; and the beam current of gun 36 was 2.5 A. The coating deposition rate was 50–54 μm/min.

X-ray analysis of the substrate showed that the coating consists of titanium carbide and excess titanium. Again, no free carbon was found. The composition analysis revealed that the titanium carbide content in the coating was 76.4% wt.

SPECIFIC EXAMPLE 3

The conditions of this example are similar to those described in the Example 1, except for the fact that tantalum was used to form refractory surface 26 from which titanium was evaporated. The beam current of gun 32 was 0.8 A; the beam current of the gun 34 was 2.8 A; and the beam current of gun 36 being 2.5 A. The coating deposition rate was 58–62 μm/min.

X-ray analysis of the coating showed that it consists of titanium carbide and excess titanium. No free carbon was found. The composition analysis showed that the titanium carbide content in the coating was 70% wt.

SPECIFIC EXAMPLE 4

The conditions of this example are similar to those described in the Example 1, except for the fact that an alloy of titanium containing 5% wt. aluminum was used as the material of ingot 20 as compared with pure titanium. The beam current of gun 32 was 0.8 A; the beam current of gun 34 was 2.8 A; and the beam current of gun 36 being 3.2 A. The coating deposition rate was 100–105 μm/min.

X-ray analysis of the coating showed that it consists of titanium carbide and TiAl as a binder. The composition analysis showed that the titanium carbide content in the coating is equal to 88.5% wt.

While the above description constitutes the preferred embodiments of the present invention, it will be appreciated that the invention is susceptible of modification, variation and change without departing from the proper scope and fair meaning of the accompanying claims.

We claim:

1. An apparatus for producing a metallic carbide coating, comprising:
   an enclosed vessel;
   means for holding a blank in said vessel of a carbon containing material;
   means for holding an ingot in said vessel of a material containing a metal taken from the group including titanium, boron and silicon;
   a refractory surface positioned adjacent said ingot such that a melt of molten material from said ingot flows onto said surface;
   a first radiant heating means for heating said blank for producing a carbon vapor flow within said vessel;
   a second radiant heating means for heating said ingot for producing a melt of said ingot which flows onto said refractory surface;
   a third radiant heating means for heating said melt on said refractory surface thereby producing a metal vapor flow within said vessel; and
   means for positioning a substrate within said vessel whereby said substrate becomes coated with a layer containing a metal carbide.

2. An apparatus for producing a metallic carbide coating according to claim 1 wherein said refractory surface is formed from a material taken from the group including carbon, hafnium, niobium, molybdenum, tantalum and tungsten.

3. An apparatus for producing a metallic carbide coating according to claim 1 wherein at least one of said radiant heating means comprises an electron beam gun.

4. An apparatus for producing a metallic carbide coating according to claim 1 wherein said melt of said ingot flows onto said refractory surface by gravity.

5. An apparatus for producing a metallic carbide coating according to claim 1 further comprising means for advancing said blank of carbon containing material within said vessel as said blank is consumed.

6. An apparatus for producing a metallic carbide coating according to claim 1 further comprising means for advancing said ingot within said vessel as said ingot is consumed.

7. An apparatus for producing a titanium carbide coating, comprising:
   an enclosed vessel;
   means for holding a blank in said vessel of a carbon containing material;
   means for holding an ingot in said vessel of a material containing titanium;
   a refractory surface positioned adjacent said ingot such that a melt of molten material from said ingot flows onto said surface;
   a first electron beam heating means for heating said blank for producing a carbon vapor flow within said vessel;
   a second electron beam heating means for heating said ingot for producing a melt of said molten material which flows onto said refractory surface;
   a third electron beam heating means for heating said melt on said refractory surface thereby producing a titanium vapor flow within said vessel; and
   means for positioning a substrate within said vessel whereby said substrate becomes coated with a layer containing said titanium carbide.

8. A method of coating a substrate with a layer of a metallic carbide, comprising the steps of:
   providing a vessel;
   placing a blank of a carbon containing material within said vessel;
   placing an ingot of a material contains one or more metals taken from the group including titanium, boron and silicon within said vessel;
   providing a refractory surface adjacent said ingot;
   heating said blank causing a carbon vapor flow within said vessel;
   heating said ingot causing a melt of molten material from said ingot to flow onto said refractory surface;
   heating said refractory surface causing a vapor flow of metal within said vessel; and
   positioning said substrate within said vessel whereby said substrate becomes coated with a layer containing said metal carbide.

9. A method for producing a substrate with a layer of metallic carbide according to claim 8 further comprising the step of heating said substrate within said vessel.

10. A method for producing a substrate with a layer of metallic carbide according to claim 8 wherein said refractory surface is formed from material taken from the group including carbon, hafnium, niobium, molybdenum, tantalum and tungsten.

11. A method for producing a substrate with a layer of metallic carbide according to claim 8 further comprising the step of advancing said blank within said vessel as said blank is consumed.

12. A method for producing a substrate with a layer of metallic carbide according to claim 8 further comprising the step of advancing said ingot within said vessel as said ingot is consumed.

* * * * *